United States Patent [19]

O'Toole, III et al.

[11] Patent Number: 4,937,529

[45] Date of Patent: Jun. 26, 1990

[54] ELECTRICAL CONDUCTOR IDENTIFYING ASSEMBLY

[76] Inventors: Charles S. O'Toole, III, 11000 SW. 82nd Ave., Miami, Fla. 33156; Bennie Ficarrotta, Jr., 6007 Rosewood Dr., Tampa, Fla. 33615

[21] Appl. No.: 303,787

[22] Filed: Jan. 30, 1989

[51] Int. Cl.$^5$ ............................................. G01R 31/02
[52] U.S. Cl. ........................................ 324/66; 324/539
[58] Field of Search ......................... 324/539, 542, 66; 379/25, 26

[56] References Cited

U.S. PATENT DOCUMENTS

| | | | |
|---|---|---|---|
| 2,814,774 | 11/1957 | Wong | 324/542 |
| 3,217,244 | 11/1965 | Glover | 324/539 |
| 3,681,686 | 8/1972 | Connally | 379/25 |
| 3,891,811 | 6/1975 | Miller | 324/66 |
| 4,074,187 | 2/1978 | Miller et al. | 324/542 |
| 4,114,091 | 9/1978 | Howard | 324/542 |
| 4,418,312 | 11/1983 | Figler | 324/542 |
| 4,445,086 | 4/1984 | Bulatao | 324/66 |

Primary Examiner—Gerard R. Strecker
Assistant Examiner—Maura K. Regan
Attorney, Agent, or Firm—Malloy & Malloy

[57] ABSTRACT

An identification assembly designed to locate and identify one of a large number of collectively disposed electrical conductors such as coaxial cables, applicable when interconnecting one end of the conductor for interconnection to a control console. A control unit attachable to one end of a specific conductor is capable of directing current flow to the conductor to activate an indicator unit attached to the opposite end of the conductor wherein activation serves to distinguish and identify the opposite end for attachment to the correct positioning in a control console, panel or the like.

2 Claims, 1 Drawing Sheet

U.S. Patent   Jun. 26, 1990   4,937,529
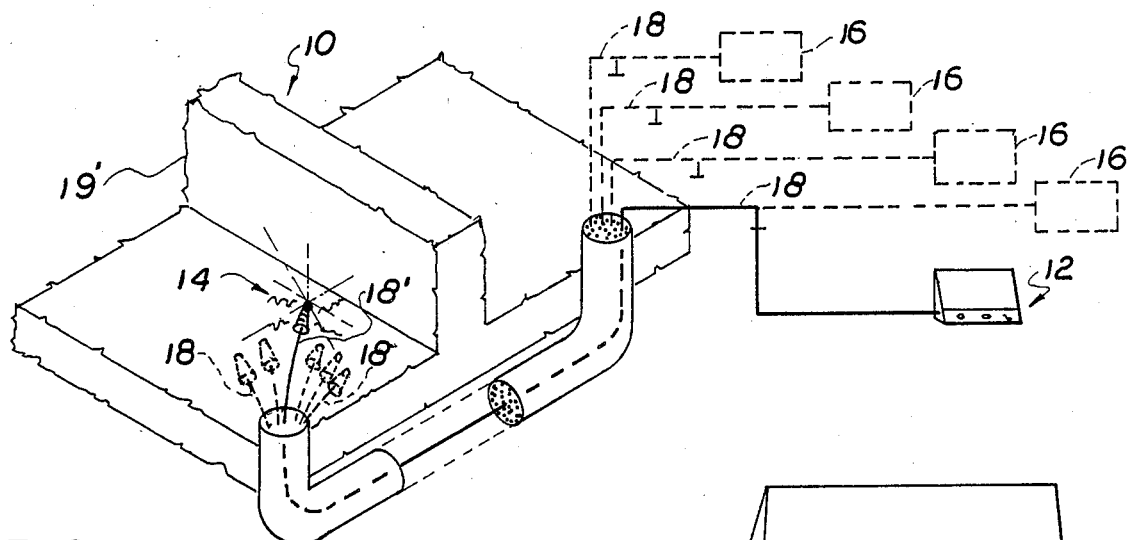
FIG. 1
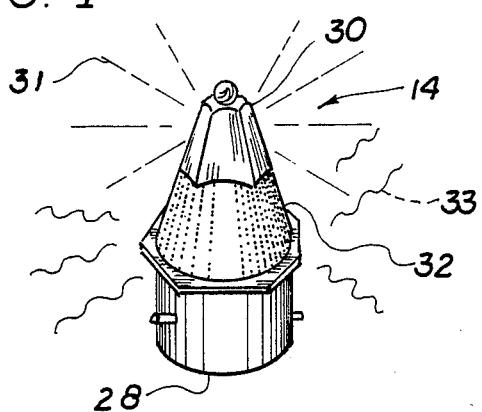
FIG. 3
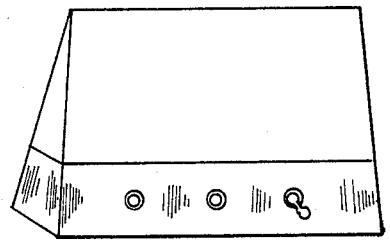
FIG. 2
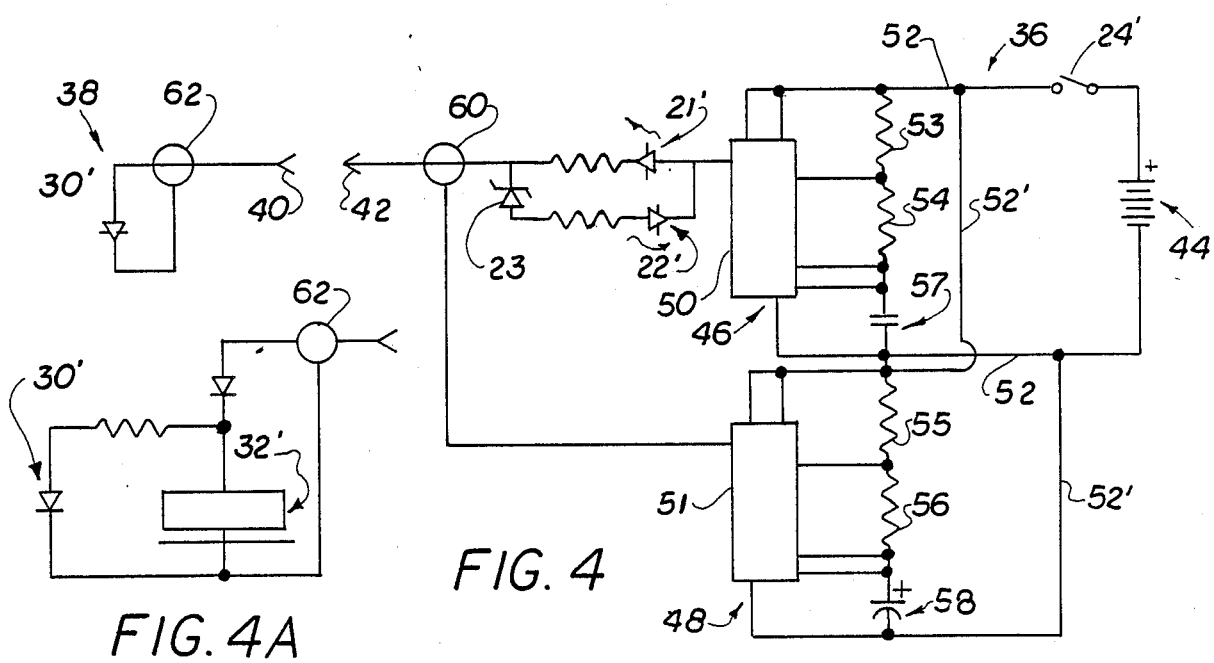
FIG. 4
FIG. 4A

ELECTRICAL CONDUCTOR IDENTIFYING ASSEMBLY

BACKGROUND OF THE INVENTION

1. Field of the Invention

An assembly used to identify the opposite ends of one of a large number of coaxial cables or like electrical conductors by passing a current through the conductor to activate an indicator unit secured to a remotely disposed end thereby identifying the remote end from what may be hundreds of other conductor ends which are collectively packaged.

2. Description of the Prior Art

With the advent of modern computer technology, it is quite common for a variety of business and professional fields to incorporate a plurality of "terminals". Such terminals may each comprise individual computerized hardware incorporating display screens, keyboards or other computer facilities located at a variety of spaced-apart physical locations throughout the physical layout of a given business or professional establishment. Commonly, all of the plurality of terminals are interconnected to a remotely located hardware facility such as a centralized memory bank, printer station, or like computer facilities. When hardware installation of the type set forth above is contemplated, wiring of such facility to the extent of interconnecting the plurality of terminals to the central control facility is accomplished by providing a large "package" of electrical conductors extending from the central control facility to the location for the plurality of terminals. Such a "package" of conductors generally include a very large number, typically in the hundreds, of cables each intended to be connected to separate terminals or like facilities which need to electrically communicate with the central control facility. When interconnecting each of the separate terminals, one or more of the cables are attached at the "terminal end" to the terminal facility. Naturally, for accurate electronic communication, the opposite end of the same coaxial cable must be identified for accurate attachment to the applicable central control facility. The identification of the individual cables has become a well recognized problem in the prior art associated with such technology. Mechanical tags of plastic or like material are frequently applied to each of the hundreds of cables or conductors at opposite ends thereof. The use of this type of marking system contemplates that the cable used at the terminal end of the conductor package will be indicated with an appropriate marking which can be found by mechanically examining the "control end" of the conductor package by physically examining each of the control ends of the conductor cables until a matching marker or tag is located. This procedure is time consuming and less than reliable. During periods of non-use and/or installation such markers are frequently dislodged thereby rendering such a physical marking procedure useless.

Other means of locating an individual cable include the use of one or more electricians physically testing each cable end of sometime hundreds or more cables through conventional electronic instruments to determine the individual cable being utilized. This procedure has been known to take as long as 12 hours and therefore be extremely costly due to the high hourly rate demanded by electricians.

There are several electrical testing devices in the existing art which are well known and include the use of diodes as indicators. The diodes in these devices could be used to identify opposite ends of an electrical conductor, but this is only a secondary function and is only possible when the electrical conductor being tested is relatively short in length and both ends are in the vicinity of the operator. However, these electrical testing devices as currently structured can not be used to locate opposite ends of a 5,000 foot cable where one end of the cable is in a remote location at a distance in the range of 5000 feet. One prior art device is disclosed in Miller, U.S. Pat. No. 4,074,187, which is a pure "cable testing" device. The invention to Miller teaches a device which is primarily used to check for continuity, phasing and shorts in multiple pair cables having a relatively short length. The invention to Miller cannot be used to identify opposite ends of a 1000–5000 foot cable where one end is at some remote location. Similarly, the German Patent to Strack, No. 2,644,134, discloses a "test" device which is used for testing multiple pair conductors for shorts and open circuits. The Strack patent is directed to a device for testing electrical conductors for faults, it is not an identification device for use in locating a remote end of an electrical cable.

Accordingly, there is a need in the industry for effectively identifying one of a large number of cables by indicating a control end of a given cable once the terminal end of that cable has been chosen at some remote location up to 5,000 feet away for interconnection at a given terminal site. Such a facility should be reliable, relatively inexpensive, and operable to accomplish the required identification in a minimum amount of time.

SUMMARY OF THE INVENTION

The present invention is directed to an electrical conductor or coaxial cable identifying assembly specifically used for the identifying of individual ones of a large number of collectively packaged conductors. Such identifying procedure is needed when selecting an individual coaxial cable, or like conductor, for the electrical interconnection of a terminal or any applicable computer or electronic facility, to a main control console or similar control facility located remotely from the terminal.

More specifically, the identifying assembly of the present invention comprises a control unit including control circuitry and preferably a portable power source such as a d.c. battery electrically connected to the control circuitry. An on/off switch is disposed in current regulating relation to the remainder of the control circuitry and the control circuitry includes signal means. The signal means associated with the control unit preferably comprises one or more illumination devices which may be light emitting diodes (LED). The control circuitry also includes a zener diode for noise reduction, thereby increasing the effective range that the identifying signal can be reduced. In this manner, the user can identify opposite ends of a cable having a length in the range of 5,000 feet where the control end of the cable is generally in some remote location at a considerable distance from the terminal end.

The control unit and accordingly, the control circuitry is electrically connected to a "terminal end" of one coaxial cable or like conductor of a plurality of such collectively packaged conductors. The opposite end of the conductor may be referred to as the "control end" in that it is remotely disposed and intended to be connected to a control console or other like computer facilities to which one or more of the remotely located terminals must be electronically connected. The control end is electrically attached to an indicator unit which includes a first signal means. Upon activation of the switch associated with the control unit, current flow is directed through the selected conductor from the terminal end to the control end from the power source associated with the control circuitry of the control unit. The receiving of current flow by the indicator unit activates the signal means of the indicator unit thereby setting off an audible and/or visual signal to indicate the specific one coaxial cable of the hundreds of other such coaxial cables.

Typically, if all of the unused coaxial cables at the control end are secured to separate indicator units, the selection and connection of any one of the unused conductors to the control unit at the terminal end can readily determine the identity and location of the selected cable used for interconnection of a given terminal to the control facility remotely located.

The invention accordingly comprises the features of construction, combination of elements, and an arrangement of parts which will be exemplified in the construction hereinafter set forth, and the scope of the invention will be indicated in the claims.

BRIEF DESCRIPTION OF THE DRAWINGS

For a fuller understanding of the nature of the present invention, reference should be had to the following detailed description taken in connection with the accompanying drawings in which:

FIG. 1 is an isometric view in partial cut-away and schematic form representing interconnection and selection of one of a large number of conductors using a control unit at a terminal end and an indicator unit at a control end to identify the prechosen conductor in accordance with the identifying assembly of the present invention.

FIG. 2 is an isometric view of the control unit of the present invention.

FIG. 3 is an isometric view of the indicator unit of the present invention.

FIG. 4 is a circuit diagram of the control circuitry associated with the control unit and its electrical interconnection to the associated circuitry of the indicator unit.

FIG. 4A is a circuit diagram of the circuitry associated with the indicator unit including an LED and a speaker assembly.

Like reference numerals refer to like parts throughout the several views of the drawings.

DETAILED DESCRIPTION OF THE PREFERRED EMBODIMENT

As shown in FIG. 1, the identifying assembly of the present invention and its specific application to the identification of a single electrical conductor 18' is generally indicated as 10. Conductor 18' is selected from a large number of collectively packaged conductors 18 as shown. More specifically, the identifying assembly of the present invention comprises a control unit generally indicated as 12 and an indicator unit generally indicated as 14. The control unit is secured to what may be referred to as the "terminal end" of the preselected conductor 18' of the large number of collectively packaged conductors 18. The terminal end is defined by the end of the conductors each available to be electronically connected to a plurality of terminals 16 independently located from one another and possibly disposed in convenient locations throughout the physical plant or layout of a business or professional facility in which such terminals are located. The opposite end of the preselected coaxial cable 18' may be referred to as the "control end" in that these ends of the coaxial cables 18 are attached to a central control facility which may vary such as a central printer, computer facility, central control base, etc. Typically, the opposite ends of the electrical conductors 18 are located remotely from one another and are collectively packaged and positioned between a false floor facility 19. The floor 19 can be removed or otherwise structured to provide access to the control ends of the collectively packaged conductors 18. Also, the plurality of terminals 16 may be located in different remotely located rooms separated by a wall facility 19'.

In the utilization of the identifying assembly of the present invention, all of the unused coaxial cables or conductors 18 have an individual indicator unit 14 secured to the control end thereof as shown in FIG. 1. Accordingly, when an individual terminal 16' is intended to be installed or connected to a control facility located at the control end of the collectively packaged conductors, one conductor 18' is selected as shown in FIG. 1. The terminal end of this conductor is then connected to the control unit 12 prior to connection to the intended terminal 16'. Activation of the control unit, as explained in greater detail hereinafter, will serve to send a flow of current through the selected conductor 18'. Such current will be received by the indicator unit 14 attached to the selected conductor 18' and such flow of current will serve to activate a first signal means associated with the indicator unit 14. In that the remainder of the indicator units not energized or activated will remain "quiet" the selected coaxial cable 18' will be instantly identified through the activation of the energized indicator unit 14 thereby setting off an audible and visual signal 30 and 32, again as shown in FIG. 1.

With reference to FIGS. 2, 3, 4, and 4A, the indicator unit is generally indicated as 14 and includes a casing or base housing 28. The housing includes a first signal means which in a preferred embodiment comprises a visual or illuminated signal structure 30 or 30' and an audio signal structure 32 or 32'. As shown in FIG. 4, a representative circuitry of the signal unit 14 is generally indicated as 38 and includes a loop-type current passing conductor 62 interconnected to an incoming terminal 40 secured to the control end of the selected conductor 18'. An LED 30' is structured to be activated upon current passing therethrough. The LED therefore is illuminated so as to clearly indicate and identify the corresponding and remotely located opposite end or control end of the selected cable 18' when current is directed through the indicator unit 14. Additionally, an audible signal structure 32 may be incorporated in the circuit so as to "sound" when current is passed therethrough thereby providing both visual and audio signaling features as represented by illumination signal 31 and audio signals 33 in FIG. 3 and schematically in FIG. 4A.

As shown in FIGS. 2 and 4, the control unit 12 includes a housing 20 which is structured to have removably mounted therein a d.c. power source such as a battery 44 (see FIG. 4) serving to provide current flow through the control circuitry 36 and through the length of the selected cable 18' to the indicator unit 14 and circuitry 38 associated therewith. A switch 24 (FIG. 2) and 24' as represented in control circuitry 36 is provided so as to control current flow and determine activation of the entire identifying assembly. As shown in FIGS. 2 and 4, the control unit 12 further includes a second signal means including a first control signal structure 21 and a second control signal structure 22 indicated schematically in the circuit diagram of FIG. 4 as 21' and 22' respectively. The first and second signal structures are both preferably of an LED construction so as to illuminate when current passes therethrough. More specifically, the first signal structure 21, 21' is activated by placement in the control circuitry 36 downstream of the power source 44 and timing sub-assemblies 50 and 51 to be described in greater detail hereinafter. The position and structure of the signal means is such that the first signal structure 21, 21' is activated upon current passing therethrough. Current passage through the LED 21' and beyond resistor 43 through return conductor 60 and cable terminal 42 indicates proper current flow through the control circuitry and through the conductor to the indicator unit 14. However, if the indicator unit is not properly activated or is not attached, a loop circuit is activated which includes the LED 22' and resistor 44. The activation of the second signal structure 22, 22' indicates a "short circuit" condition when the indicator element 14 is not attached or not properly activated. This is to provide convenience in the checking and location of any given coaxial cable 18' proving that the circuitry as well as the identifying assembly generally is operating properly. Further structural features of the control circuitry 36 includes a first timer unit 50 associated with the timer sub-assembly 46 and which may be of substantially conventional construction. The timer unit 50 is connected across the power source 44 and current flow regulating switch 24'. Conductors 52 serve to interconnect the timer assembly 50 in the aforementioned manner. A plurality of resistors 53, 54 and capacitor 57 serves to regulate current flow to and from the timer assembly 50. A second timer sub-assembly 48 is provided and includes second timer assembly 51 and a plurality of resistors 55, 56 and variable capacitor 58 interconnected in parallel to the first timer element 50 by connecting conductors 52'. The control circuitry 36 further includes a zener diode 23 connected in series between LED 21' and LED 22'. The zener diode 23 effectively reduces noise within the circuitry thereby increasing the maximum length of cable to be identified to as much as 5,000 feet.

By virtue of this construction, and as set forth above, current flow from power source 44 upon closing of switch 24, 24' will create current flow through the attached conductor or coaxial cable 18' secured at its opposite ends to the control unit 12 and indicator unit 14. Receiving of current flow through the indicator unit 14 will cause activation of the first signal means and more specifically an illuminated signal structure and/or an audible signal structure 30 and 32.

Similarly, the second signal means includes first control signal structure 21, 21' comprising an illuminated LED 21'. Also, the second control signal structure 22, 22' (LED 22') is activated if complete current flow is not made to the indicator unit 14 and/or if the indicator unit 14 is inoperable.

It is therefore to be understood that the following claims are intended to cover all of the generic and specific features of the present invention herein described, and all statements of the scope of the invention which as a matter of language, might be said to fall therebetween.

Now that the invention has been described, what is claimed is:

1. An identifying assembly 10 designed to identify remotely located ends of individual elongated electrical conductors 18, wherein the opposite ends of said conductors are disposed in a large group of such conductors, said assembly comprising:
   (a) a control unit 12 attachable to one end of one elongated electrical conductor 18' of a plurality of commonly disposed conductors 18 and including electrical power source 44 connected to said control unit 12.
   (b) a plurality of indicator units 14, each being individually attachable to an opposite end of one 18' of a plurality of commonly disposed conductors 18 and structured to receive current passing through the correspondingly attached conductor,
   (c) each of said indicator units 14 comprising a first signal means 30 and 32 for indicating current flow to said indicator unit through the conductor from said control unit,
   (d) said first signal means of said indicator units 14 comprising an illuminated signal structure 30 visually discernible when activated by current flow through the conductor 18' attached to said indicator unit 14, said illuminated signal structure 30 comprising a light emitting diode,
   (e) said first signal means of said indicator unit 14 further comprising an audio signal structure 32 audibly discernible when activated by a current flow through the conductor attached to said indicator unit,
   (f) said control unit 12 comprising control circuitry 36 including a switch assembly 24 connected in current controlling relation between said power source and a remainder of said control circuitry, whereby activation of the entire circuitry is facilitated,
   (g) said control unit 12 and one of said indicator units 14 being electrically interconnected through respective attachment to opposite ends of the conductor 18' and said control circuitry structured to deliver current flow to said indicator unit through the conductor from said power source 44,
   (h) said control unit further comprising a second signal means 21 and 22 including a first control signal structure 21 interconnected to said control circuitry 36 and structured for activation upon current flow passing from said power source 44 through the control circuitry 36 and the attached conductor 18' and to said indicator unit 14,
   (i) said second signal means further comprising a second control signal structure 22 interconnected to said control circuitry 36 and structured for activation upon current flow directed thereto and failure of current flow to said indicator unit 14, the latter condition being indicative of a short circuit condition between said power source 44 and said indicator unit 14,
   (j) said first control signal structure 21 and said second control signal structure 22 comprising a light emitting diode structured and disposed for visual observation upon activation thereof,
   (k) the current flow through the conductor 18' and between said control unit 12 and said indicator unit 14 being evidenced by activation of said first signal means 30 and 32 and distinguishing the end of the conductor 18' attached to said indicator unit 14 and identifying the conductor 18' from a plurality of other similarly placed conductors 18, and (l) said control unit further comprising noise reduction means 23 interconnected to said control circuitry 36 for reducing noise within said circuitry and thereby substantially increasing the maximum length between said opposite ends of the conductor 18' to be identified while still permitting the activation of said first and second signal means.

2. An assembly as in claim 1 wherein the power source 44 comprises a direct current battery removably connected to said control circuitry 36, said switch means 24 disposed in current controlling relation between said battery and a conductor 18' attached to said control unit 12.

* * * * *